(12) United States Patent
Drogi

(10) Patent No.: US 9,794,884 B2
(45) Date of Patent: *Oct. 17, 2017

(54) ENVELOPE TRACKING SYSTEM WITH ADJUSTMENT FOR NOISE

(71) Applicant: Quantance, Inc., Woburn, MA (US)

(72) Inventor: Serge Francois Drogi, Flagstaff, AZ (US)

(73) Assignee: QUANTANCE, INC., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/045,659

(22) Filed: Feb. 17, 2016

(65) Prior Publication Data

US 2016/0165543 A1 Jun. 9, 2016

Related U.S. Application Data

(63) Continuation of application No. 14/207,296, filed on Mar. 12, 2014, now Pat. No. 9,271,236.

(60) Provisional application No. 61/783,665, filed on Mar. 14, 2013.

(51) Int. Cl.
*H04B 17/02* (2006.01)
*H04W 52/02* (2009.01)
*H04L 12/26* (2006.01)
*H04B 1/04* (2006.01)

(52) U.S. Cl.
CPC .......... *H04W 52/0238* (2013.01); *H04B 1/04* (2013.01); *H04L 43/16* (2013.01); *H04B 2001/0416* (2013.01); *Y02B 60/50* (2013.01)

(58) Field of Classification Search
CPC ......... H03F 2200/102; H03F 2200/451; H03F 3/19; H03F 1/0227; H03F 3/245; H03F 1/0222; H03F 3/21; H03F 2200/387
USPC ............ 455/69, 522, 127.1, 127.2, 136, 138
See application file for complete search history.

(56) References Cited

U.S. PATENT DOCUMENTS

| | | | |
|---|---|---|---|
| 4,709,404 | A | 11/1987 | Tamura et al. |
| 6,084,468 | A | 7/2000 | Sigmon et al. |
| 6,130,910 | A | 10/2000 | Anderson et al. |
| 6,646,501 | B1 | 11/2003 | Wessel |

(Continued)

FOREIGN PATENT DOCUMENTS

| | | |
|---|---|---|
| GB | 2489002 A | 9/2012 |
| WO | 03017468 A2 | 2/2003 |

(Continued)

OTHER PUBLICATIONS

Supplementary Partial European Search Report for corresponding EP Application No. 147763593 dated May 10, 2016.

(Continued)

*Primary Examiner* — Tu X Nguyen
(74) *Attorney, Agent, or Firm* — Lando & Anastasi, LLP

(57) ABSTRACT

An envelope tracking transceiver dynamically adjusts envelope tracking parameters to achieve the desired tradeoff between noise performance and power efficiency. When higher levels of noise are acceptable, the envelope tracking transceiver dynamically adjusts transmitter parameters to achieve better power efficiency while sacrificing noise performance. When lower levels of noise are desired, the envelope tracking transceiver dynamically adjusts parameters to achieve better noise performance while sacrificing efficiency.

20 Claims, 2 Drawing Sheets

(56) References Cited

U.S. PATENT DOCUMENTS

| | | |
|---|---|---|
| 7,869,549 B2 | 1/2011 | Yang et al. |
| 8,018,277 B2 | 9/2011 | Drogi et al. |
| 8,050,638 B2 | 11/2011 | Vinayak et al. |
| 8,064,852 B2 | 11/2011 | Pennec |
| 8,072,205 B1 * | 12/2011 | Deo .................... G01R 19/003 324/76.13 |
| 8,183,917 B2 | 5/2012 | Drogi et al. |
| 8,742,844 B2 | 6/2014 | Kousai |
| 8,928,403 B2 | 1/2015 | Bartram |
| 9,270,239 B2 | 2/2016 | Drogi et al. |
| 9,271,236 B2 | 2/2016 | Drogi |
| 2002/0044014 A1 | 4/2002 | Wright et al. |
| 2002/0090921 A1 | 7/2002 | Midtgaard et al. |
| 2003/0076172 A1 | 4/2003 | Tichauer |
| 2003/0198300 A1 | 10/2003 | Matero et al. |
| 2004/0172242 A1 | 9/2004 | Seligman et al. |
| 2005/0079835 A1 | 4/2005 | Takabayashi et al. |
| 2006/0087372 A1 | 4/2006 | Henze |
| 2006/0199553 A1 | 9/2006 | Kenington |
| 2006/0209944 A1 | 9/2006 | Carballo et al. |
| 2006/0290421 A1 * | 12/2006 | Ichitsubo ................ H01L 23/66 330/66 |
| 2007/0066224 A1 | 3/2007 | d'Hont et al. |
| 2007/0178854 A1 | 8/2007 | Sutardja |
| 2007/0183532 A1 | 8/2007 | Matero |
| 2007/0184795 A1 | 8/2007 | Drogi et al. |
| 2008/0261543 A1 | 10/2008 | Hara et al. |
| 2009/0004981 A1 | 1/2009 | Eliezer et al. |
| 2009/0068966 A1 | 3/2009 | Drogi et al. |
| 2009/0117865 A1 | 5/2009 | Vinayak et al. |
| 2009/0256630 A1 | 10/2009 | Brobston |
| 2009/0295475 A1 | 12/2009 | Bar-David et al. |
| 2010/0112967 A1 | 5/2010 | Sorensen |
| 2010/0266137 A1 | 10/2010 | Sibbald et al. |
| 2010/0311365 A1 | 12/2010 | Vinayak et al. |
| 2011/0043282 A1 | 2/2011 | Drogi et al. |
| 2011/0075745 A1 | 3/2011 | Kleider et al. |
| 2011/0148519 A1 | 6/2011 | Drogi et al. |
| 2011/0298539 A1 | 12/2011 | Drogi et al. |
| 2012/0200354 A1 | 8/2012 | Ripley et al. |
| 2012/0223777 A1 | 9/2012 | Drogi et al. |
| 2012/0252382 A1 | 10/2012 | Bashir et al. |
| 2012/0269240 A1 | 10/2012 | Balteanu et al. |
| 2012/0326686 A1 | 12/2012 | Dai et al. |
| 2013/0033314 A1 | 2/2013 | Gudem et al. |
| 2013/0076418 A1 | 3/2013 | Belitzer et al. |
| 2013/0187711 A1 * | 7/2013 | Goedken ............... H03F 1/0227 330/149 |
| 2013/0231069 A1 | 9/2013 | Drogi |
| 2014/0235185 A1 | 8/2014 | Drogi |
| 2014/0241462 A1 | 8/2014 | Bellaouar et al. |
| 2014/0266423 A1 | 9/2014 | Drogi et al. |
| 2014/0274227 A1 | 9/2014 | Drogi |
| 2015/0123735 A1 | 5/2015 | Wimpenny |

FOREIGN PATENT DOCUMENTS

| | | |
|---|---|---|
| WO | 2010064091 A1 | 6/2010 |
| WO | 2012170831 A1 | 12/2012 |

OTHER PUBLICATIONS

PCT International Search Report and Written Opinion, PCT Application No. PCT/US2014/024999, Jul. 14, 2014, 12 pages.

Kimball, D.F. et al., "High-Efficiency Envelope-Tracking W-CDMA Base-Station Amplifier Using GaN HFETs," IEEE Transactions on Microwave Theory and Techniques, Nov. 2006, pp. 3848-3856, vol. 54, No. 11.

Wang, F. et al., "Design of Wide-Bandwidth Envelope-Tracking Power Amplifiers for OFDM Applications," IEEE Transactions on Microwave Theory and Techniques, Apr. 2005, pp. 1244-1255, vol. 53, No. 4.

Xu, J., "Full Transmitter Linearization Using a Wideband DPD Measurement Platform," Microwave Journal Jan. 15, 2013, pp. 96-104.

Extended European Search Report from corresponding EP Application No. 16175782.8 dated Dec. 5, 2016.

* cited by examiner

ENVELOPE TRACKING SYSTEM WITH ADJUSTMENT FOR NOISE

CROSS-REFERENCE TO RELATED APPLICATIONS

This application claims the benefit under 35 U.S.C. §120 as a continuation of U.S. patent application Ser. No. 14/207,296, titled "ET SYSTEM WITH ADJUSTMENT FOR NOISE," filed on Mar. 12, 2014, which claims the benefit of U.S. Provisional Patent Application No. 61/783,665, titled "ET SYSTEM WITH ADJUSTMENT FOR NOISE," filed on Mar. 14, 2013, each of which is hereby incorporated herein by reference in its entirety.

BACKGROUND

This disclosure relates generally to a radio frequency transceiver, and more, specifically to an envelope tracking system in a radio frequency transceiver.

Envelope Tracking (ET) systems are commonly utilized in the radio frequency (RF) transmitter section of a radio where power efficiency is important such as in cellular radios used in mobile phones. A typical ET system includes an RF power amplifier (PA) utilizing a variable power supply, which supplies the PA with a dynamically changing supply voltage that tracks the amplitude of the modulation. The goal of such an ET system is generally to improve efficiency by operating the PA with low headroom.

SUMMARY

Embodiments include an envelope tracking transceiver that adjusts envelope tracking parameters to achieve desired noise performance and power efficiency. In a first embodiment, an envelope tracking transceiver comprises a power amplifier, a lookup circuit, a power supply, a receiver, and a configuration circuit. The power amplifier receives an input signal and generates an amplified output signal. The power amplifier also receives a supply voltage providing power to the power amplifier. The lookup circuit generates a power supply control signal based on an estimated amplitude of the input signal and a feedback signal indicating a compression level for operating the power amplifier. The power supply provides the supply voltage to the power amplifier based on the power supply control signal. The receiver receives a receive signal and generates a noise margin signal representative of a noise margin of the receive signal. The configuration circuit generates the feedback signal based on the noise margin signal.

In a second embodiment, the envelope tracking transceiver comprises a power amplifier, a lookup circuit, a power supply, a receiver, and a configuration circuit. The power amplifier receives an input signal and generates an amplified output signal. The power amplifier also receives a supply voltage providing power to the power amplifier. The lookup circuit generates a power supply control signal based on an estimated amplitude of the input signal. The power supply provides the supply voltage to the power amplifier based on the power supply control signal. The receiver receives a receive signal and generates a noise margin signal representative of a noise margin of the receive signal. The configuration circuit generates one or more control signals to control parameters of at least one of the power amplifier, the lookup circuit, and the power supply based on the noise margin signal.

In a third embodiment, the envelope tracking transceiver comprises a power amplifier, a lookup circuit, a power supply, and a feedback receiver. The power amplifier receives an input signal and generates an amplified output signal. The power amplifier also receives a supply voltage providing power to the power amplifier. The lookup circuit generates a power supply control signal based on an estimated amplitude of the input signal and a feedback signal indicating a compression level for operating the power amplifier. The power supply provides the supply voltage to the power amplifier based on the power supply control signal. The feedback receiver generates a noise measure in the amplified output signal and generates the feedback signal responsive to the noise measure.

The features and advantages described in the specification are not all inclusive and, in particular, many additional features and advantages will be apparent to one of ordinary skill in the art in view of the drawings and specification. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments disclosed herein can be readily understood by considering the following detailed description in conjunction with the accompanying drawings.

DETAILED DESCRIPTION

The Figures (FIG.) and the following description relate to various embodiments by way of illustration only. It should be noted that from the following discussion, alternative embodiments of the structures and methods disclosed herein will be readily recognized as viable alternatives that may be employed without departing from the principles discussed herein.

Reference will now be made in detail to several embodiments, examples of which are illustrated in the accompanying figures. It is noted that wherever practicable similar or like reference numbers may be used in the figures and may indicate similar or like functionality. The figures depict various embodiments for purposes of illustration only. One skilled in the art will readily recognize from the following description that alternative embodiments of the structures and methods illustrated herein may be employed without departing from the principles described herein.

An envelope tracking transceiver dynamically adjusts envelope tracking parameters to achieve the desired tradeoff between noise performance and power efficiency. Particularly, better power efficiency of the transmitter can be obtained by sacrificing noise performance of the transmitted and received signals of the transceiver. When higher levels of noise are acceptable, the envelope tracking transceiver dynamically adjusts transmitter parameters to achieve better power efficiency while sacrificing noise performance. When lower levels of noise are desired, the envelope tracking transceiver dynamically adjusts parameters to achieve better noise performance while sacrificing efficiency.

Figure 1:
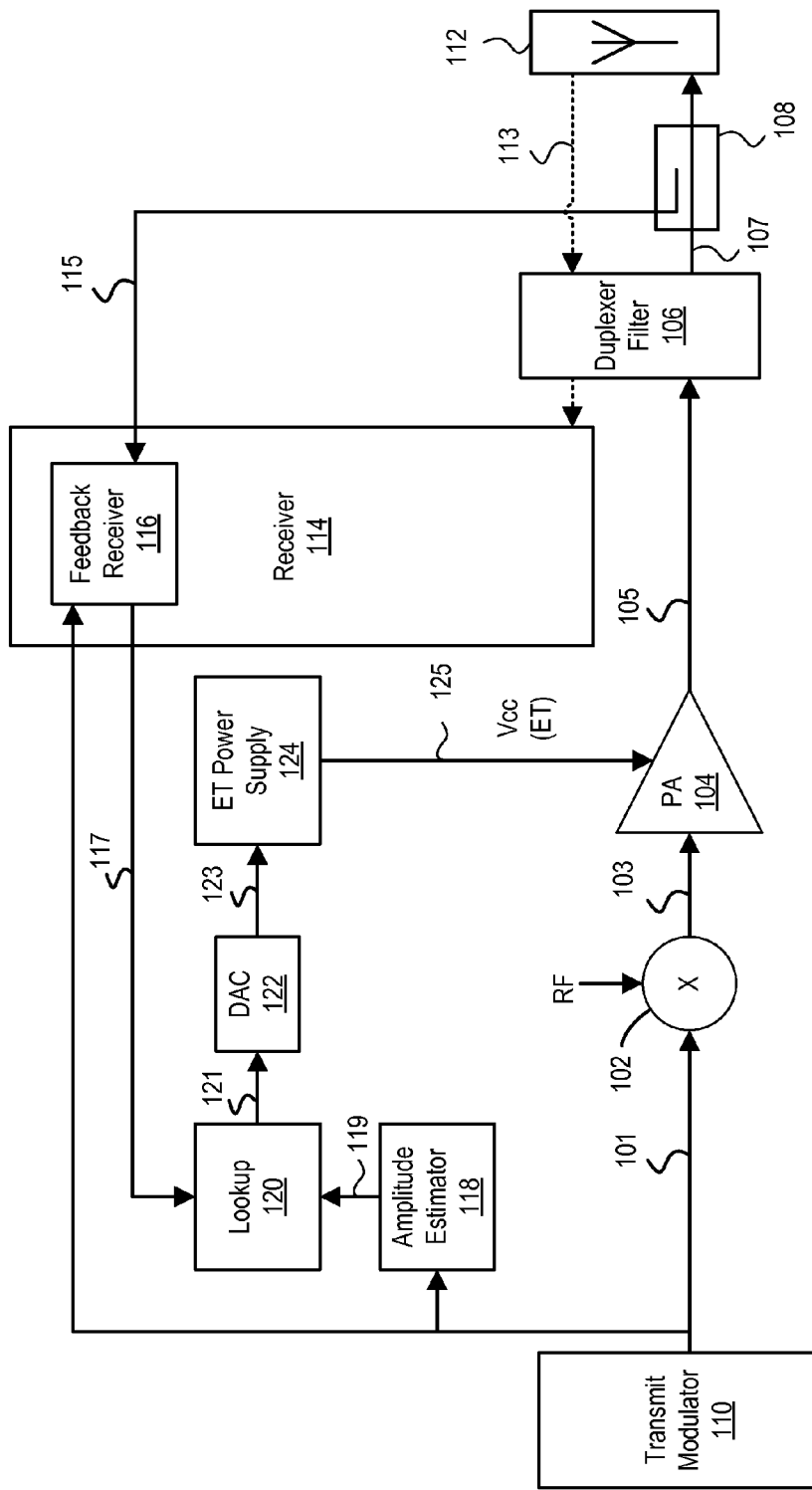
FIG. 1 is a circuit diagram illustrating a first embodiment of an ET transceiver.

FIG. 1 illustrates an embodiment of an RF transceiver 100 with an ET system. Transmit modulator 110 generates a digital transmit signal 101, which is upconverted by RF upconverter 102 to upconverted input signal 103 provided to the input of PA 104. PA 104 amplifies upconverted input signal 103 to generate amplified RF signal 105. The amplified RF signal 105 from PA 104 reaches antenna 112 as output signal 107 after passing through duplexer filter 106. Antenna 112 also receives a receive signal 113 which reaches receiver 114 after passing through duplexer filter 106. Duplexer filter 106 provides filtering between amplified RF signal 105 and a received signal 113 received by antenna 112. Coupler 108 provides a feedback signal 115 to feedback receiver 116 that is representative of output signal 107.

Digital transmit signal 101 is also provided to amplitude estimator 118 which estimates the amplitude of digital transmit signal 101. For example, in one embodiment, amplitude estimator 118 estimates the amplitude based on the equation Amplitude=sqrt($I^2+Q^2$), where I and Q are the inphase and quadrature components respectively of the digital transmit signal 101. An estimated amplitude signal 119 is provided as an index to lookup table 120, which outputs signal 121 based on the estimated amplitude signal 119 and a feedback signal 117 from feedback receiver 116. Lookup table 120 may be populated with PA supply voltage values which are appropriate for various values of estimated transmit signal amplitude signal 119 and feedback signal 117, typically determined through PA characterization.

Digital-to-analog converter (DAC) 122 converts the outputted PA supply voltage values from lookup table 120 to an analog signal 123, which controls ET power supply 124 to output specific voltages via supply voltage 125 to PA 104, so that PA 104 may operate with low headroom for good efficiency. In one embodiment, a delay alignment circuit (not shown) inserts a time delay at ET power supply 124 or within RF upconverter 102 to ensure proper time alignment between supply voltage 125 provided by ET power supply 124 and the amplified RF signal 105 at the output of PA 104.

The values in lookup table 120 may be adjusted for a desired level of compression specified by feedback signal 117. Compression refers to the voltage operating headroom of PA 104. For example, in one embodiment, values in lookup table 120 are adjusted by multiplying values in lookup table 120 by a value x. Compression increases when x is less than 1 and decreases when x is greater than 1. For example, if x=0.9, the supply voltage 125 supplied to PA 104 is effectively decreased by 10%. If x=1.1, the supply voltage 125 supplied to PA 104 is effectively increased by 10%. The desired compression levels are typically determined by PA and system characterization. For good efficiency, PA 104 may be operated with a high compression level, but the output signal from PA 104 should not exceed a level of acceptable distortion. Otherwise, if the acceptable level of distortion is exceeded, the compression level should be lowered until the acceptable level of distortion is met. Adjacent channel power (ACP) is a common indicator of distortion in PAs. Alternatively, instead of feedback signal 117 adjusting values in the lookup table 120, the feedback signal 117 may instead adjust a parameter of the amplitude estimator 118 to control compression. For example, the output of the amplitude estimator may be multiplied by the value x to increase compression when x is less than 1 and decrease compression when x is greater than 1.

Feedback receiver 116 generates feedback signal 117 to control compression based on transmit signal 101 and coupled signal 115 received via coupler 108. Feedback receiver 116 either operates continuously during normal transmitter operation, periodically during transmitter operation, or operates during a calibration mode. Feedback receiver 116 downconverts coupled signal 115 to recover a downconverted baseband signal. Feedback receiver 116 evaluates the downconverted signal, and measures distortion in signal 115, representative of distortion in output signal 107. For example, in one embodiment, feedback receiver 116 calculates ACP by observing the power in the adjacent channel (for example, by performing a fast Fourier transform and taking the ratio of the power of the desired frequency channel of signal 115 to the power of the adjacent channels). In one embodiment, feedback receiver 116 measures an error in the trajectory of coupled signal 115 as compared with the desired, baseband transmit signal 101 as generated by transmit modulator 110, calculating the difference in these signals utilizing, for example, least-mean-squared techniques. Based on such distortion assessments, feedback receiver 116 provides feedback signal 117 to adjust the values in lookup table 120 to adjust the compression level just low enough to ensure distortion levels are acceptable.

In ET systems such as the transceiver 100 of FIG. 1, PA 104 may generate some noise outside the desired RF transmit band. The noise is generated due to a number of factors, including (a) AM-AM and AM-PM characteristics inherent in PA 104, (b) nonlinearities caused by operating PA 104 with low supply voltage headroom, (c) imperfections in the PA model for generating the variable power supply voltage, and (d) bandwidth limitations in the ET power supply 124.

In particular, noise generated in the RF receive band can desensitize the RF receiver 114 of the transceiver to the receive signal 113. In cellular radios used in mobile phones, the radio system is often full duplex (the RF receiver 114 operates at the same time as the transmitter). Thus noise generated by PA 104 can feed into receiver 114 during operation. Increased compression of PA 104 may increase noise in the receive band of receive signal 113. Duplexer filter 106 functions to limit this noise, but the filtering may be insufficient.

Figure 2:
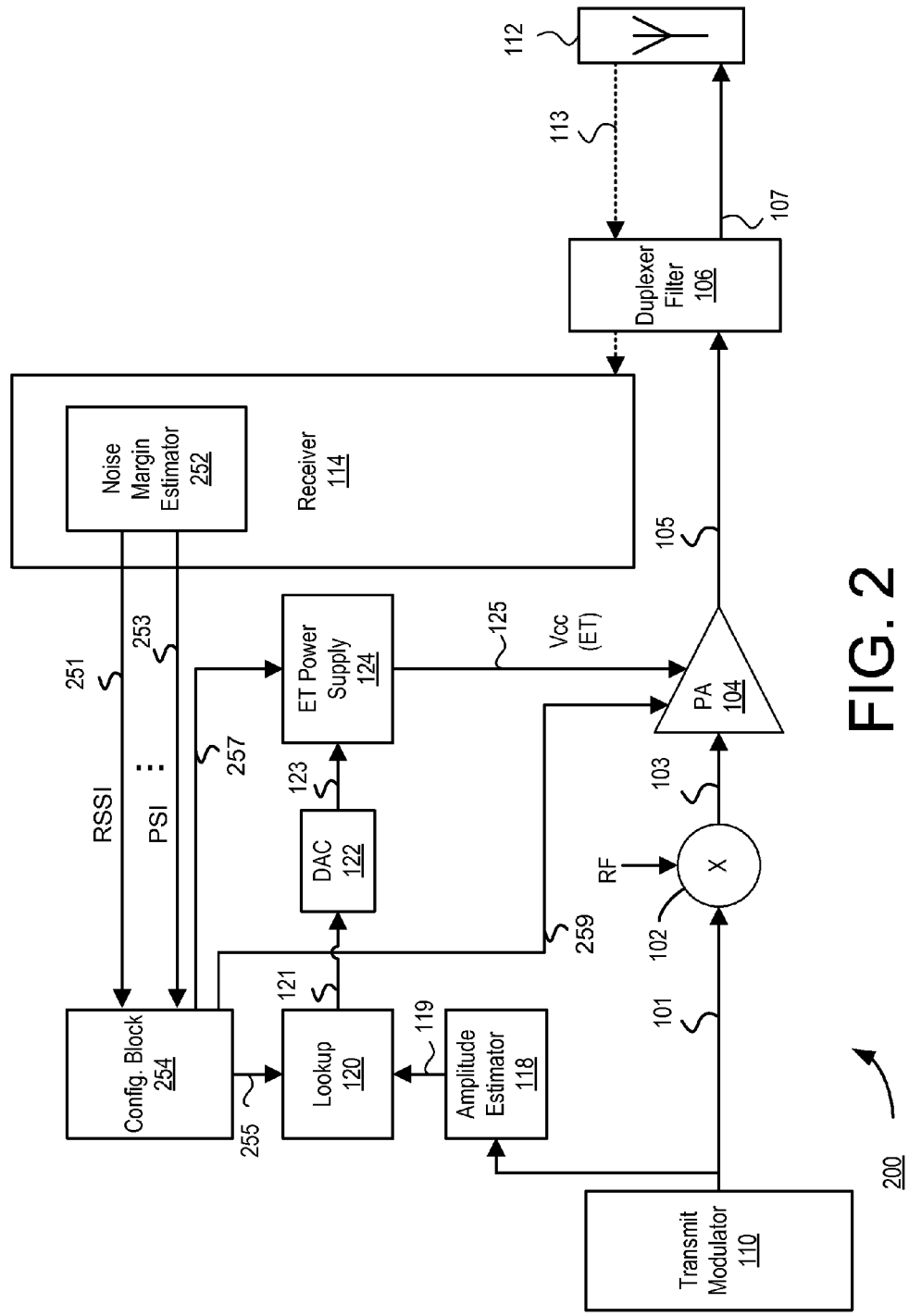
FIG. 2 is a circuit diagram illustrating a second embodiment of an ET transceiver.

FIG. 2 illustrates a second embodiment of a ET transceiver 200 in which parameters of the envelope tracking system are adjusted as a function of the tolerable noise in the receive path (receive noise margin), in order to limit the desensitization of the RF receiver 114. The system is similar to that of FIG. 1, but includes a configuration block 254 and noise margin estimator 252, and omits some details previously described.

The radio link quality is typically monitored in modern radio systems, e.g., by a noise margin estimator 252. The link quality may be assessed using parameters of the radio link such as receive signal strength, or bit or frame error rates. Thus the noise margin estimator 252 can estimate the receive noise margin at the RF receiver 114 and can provide one or more feedback signals 251, 253 to a configuration block 254 that adjusts the parameters of the envelope tracking system accordingly.

The receive noise margin will typically change dynamically, as radio conditions change. For example, many systems operate with high receive noise margins when the transmitter is used for high data rate transmission; the highest data rates will rarely be used in poor or marginal receive conditions. It is at these high data rates where the transmitter will operate at the highest power levels; thus substantial overall power savings are realized from an efficient PA. Under these conditions, the configuration block 254 adjusts the parameters of the ET system to maximize efficiency, while allowing higher than nominal receive band noise since the receive noise margin is high. Conversely, when radio conditions are poor, and the receive noise margin is low, the configuration block 254 adjusts the parameters of the ET system to minimize receive band noise, even at the expense of degraded PA efficiency.

In one embodiment, noise margin estimator 252 provides a receive signal strength indicator (RSSI) level 251 to configuration block 254 as an estimate of the receive noise margin. When a high level of RSSI is detected via signal 251 (e.g., above a threshold noise margin), configuration block 254 adjusts the parameters of the ET system to increase efficiency, even at the expense of receive band noise, since a high level of RSSI corresponds to a high receive noise margin at the RF receiver's input, and additional noise can be tolerated. For example, in one embodiment, configuration block 254 may adjust parameters in the lookup table 120 to increase compression, reduce filtering in the ET power supply 124 via control signal 257, and/or adjust biasing of the power amplifier via control signal 259. Effects of these adjustments on receive band noise and efficiency are described in further detail below.

Conversely, if a low level of RSSI is detected via signal 251 (e.g., below the threshold noise margin), configuration block 254 adjusts the parameters of the ET system to decrease receive band noise, even at the expense of efficiency, since a low level of RSSI corresponds to a low receive noise margin at the RF receiver's input, and much additional noise cannot be tolerated. For example, in one embodiment, configuration block 254 may adjust parameters in the lookup table 120 to decrease compression, increase filtering in the ET power supply 124 via control signal 257, and/or adjust biasing of the power amplifier via control signal 259. Effects of these adjustments on receive band noise and efficiency are described in further detail below.

In another embodiment, the noise margin estimator 252 detects if the system is in the presence of a public safety network. This indication may be communicated to the radio through a cellular basestation. In this case, additional emissions and noise requirements may be imposed on the radio. In one embodiment, the noise margin estimator 252 provides a public safety indicator (PSI) signal 253 to configuration block 254 which indicates to configuration block 254 that emissions and noise from PA 104 should be reduced. Configuration block 254 may adjust ET parameters in order to reduce emissions and noise, while trading off efficiency.

In yet other embodiments, a different signal representative of the noise margin can be provided to the configuration block 254, such as, for example, a signal representing a bit or frame error rate, or a signal representing a combination of the above described factors.

Configuration block 254 can adjust various parameters of the ET system based on the noise margin. For example, configuration block 254 may increase or reduce the compression of PA 104 via the lookup table 120 via feedback signal 255 to increase or decrease efficiency (with a corresponding increase or decrease in receive noise), as described earlier. Alternatively, the configuration block 254 may control compression by adjusting a parameter of the amplitude estimator 118 as described earlier.

A less compressed PA sees its gain vary less with the supply voltage applied. Thus, errors in the path from lookup table 120 to supply voltage 125 which supplies PA 104, which normally cause noise and distortion when they erroneously vary the gain of PA 104, cause less noise and distortion when PA 104 is less compressed. However, when PA 104 is less compressed, PA 104 operates with lower efficiency. Conversely, a more compressed PA sees its gain vary more with the voltage applied. Thus, errors in the supply voltage for PA 104 cause more noise and distortion when PA 104 is more compressed. However, when PA 104 is more compressed, PA 104 operates with higher efficiency.

Configuration block 254 may also adjust the filtering of the voltage control signal 123 in ET power supply 124 via filtering control signal 257. Filtering is used to limit the control bandwidth to envelope tracking power supply 124, which reduces noise because it prevents envelope tracking power supply 124 from attempting to generate rapid voltage changes to PA 104. Without the filtering, these rapid voltage changes are generated with inaccuracy due to inherent bandwidth limitations within the envelope tracking power supply 124, causing PA 104 to generate noise. However, reducing filtering allows envelope tracking power supply 124 to achieve lower supply voltages to PA 104, increasing efficiency. Thus, configuration block 254 may command greater or less filtering of voltage control signal 123 when a low or high receive noise margin, respectively, is indicated.

Configuration block 254 may also adjust the biasing of PA 104 via a bias control signal 259. Controlling the bias of PA 104 changes its AM/AM and AM/PM characteristics. Some AM/AM shapes can be more susceptible to the generation of noise, but also have higher efficiency.

Configuration block 254 may also disable the dynamic ET system altogether, commanding envelope tracking power supply 124 to provide a static supply voltage to PA 104. This may be accomplished by adjusting lookup table 120 to provide the same PA supply voltage value regardless of transmit power. Alternatively, the PA supply voltage may be held constant during certain transmit periods, and changed between periods if the output power of PA 104 changes. Disabling the dynamic ET system in this way reduces noise associated with the envelope power supply 124, and can be commanded by configuration block 254 if a low receive noise margin is indicated.

Upon reading this disclosure, those of skill in the art will appreciate still additional alternative designs for an envelope tracking system with adjustment for noise. Thus, while particular embodiments and applications have been illustrated and described, it is to be understood that the embodiments discussed herein are not limited to the precise construction and components disclosed herein and that various modifications, changes and variations which will be apparent to those skilled in the art may be made in the arrangement, operation and details of the method and apparatus disclosed herein without departing from the scope of the disclosure.

The invention claimed is:

1. An envelope tracking transceiver comprising:
   a power amplifier powered by a supply voltage and configured to receive an input signal and generate an output signal;
   a power supply configured to provide the supply voltage to the power amplifier based on a control signal;
   a lookup circuit configured to generate the control signal based on an estimated amplitude of the input signal;
   a receiver configured to receive a signal and to generate a feedback signal indicative of a noise margin of the received signal; and
   a configuration circuit configured to control at least one of the lookup circuit, the power supply, and the power amplifier based on the feedback signal to decrease noise generated by the power amplifier responsive to the noise margin being below a threshold and to allow an increase in the noise generated by the power amplifier by increasing power efficiency of the power amplifier responsive to the noise margin being above the threshold.

2. The envelope tracking transceiver of claim 1 wherein the noise generated by the power amplifier includes receive band noise.

3. The envelope tracking transceiver of claim 1 wherein the configuration circuit is configured to adjust at least one parameter of the lookup circuit to change an amount of voltage headroom of the power amplifier based on the feedback signal.

4. The envelope tracking transceiver of claim 1 wherein the configuration circuit is configured to adjust a bias of the power amplifier based on the feedback signal.

5. The envelope tracking transceiver of claim 1 wherein the configuration circuit is configured to adjust filtering of the control signal in the power supply based on the feedback signal.

6. The envelope tracking transceiver of claim 1 wherein the feedback signal includes a receive signal strength indicator.

7. The envelope tracking transceiver of claim 1 wherein the feedback signal includes at least one of a bit error rate and a frame error rate.

8. The envelope tracking transceiver of claim 1 wherein the receiver is configured to determine whether the envelope tracking transceiver is in the presence of a public safety network.

9. The envelope tracking transceiver of claim 8 wherein the receiver is configured to provide a public safety indicator signal to the configuration circuit responsive to determining that the envelope tracking transceiver is in the presence of the public safety network.

10. The envelope tracking transceiver of claim 9 wherein the configuration circuit is configured to control the at least one of the lookup circuit, the power supply, and the power amplifier to reduce the noise generated by the power amplifier responsive to receiving the public safety signal indicator signal.

11. The envelope tracking transceiver of claim 1 wherein the configuration circuit is configured to direct the lookup circuit to maintain the control signal at a substantially constant value during at least one transmit period responsive to the noise margin being below the threshold.

12. A power supply system for a transceiver that includes a power amplifier, the power supply system comprising:
  a power supply configured to provide a supply voltage to the power amplifier based on a control signal;
  a lookup circuit configured to receive an estimated amplitude of an input signal provided to the power amplifier and generate the control signal based on the estimated amplitude of the input signal; and
  a configuration circuit configured to receive a feedback signal indicative of a noise margin of a signal received by the transceiver and control at least one of the lookup circuit, the power supply, and the power amplifier based on the feedback signal to decrease noise generated by the power amplifier responsive to the noise margin being below a threshold and to allow an increase in the noise generated by the power amplifier by increasing power efficiency of the power amplifier responsive to the noise margin being above the threshold.

13. The power supply system of claim 12 wherein the noise generated by the power amplifier includes receive band noise.

14. The power supply system of claim 12 wherein the configuration circuit is configured to adjust at least one parameter of the lookup circuit to change an amount of voltage headroom of the power amplifier based on the feedback signal.

15. The power supply system of claim 12 wherein the configuration circuit is configured to adjust a bias of the power amplifier based on the feedback signal.

16. The power supply system of claim 12 wherein the configuration circuit is configured to adjust filtering of the control signal in the power supply based on the feedback signal.

17. The power supply system of claim 12 wherein the configuration circuit is configured to direct the lookup circuit to maintain the control signal at a substantially constant value during at least one transmit period responsive to the noise margin being below the threshold.

18. The power supply system of claim 12 wherein the feedback signal includes a receive signal strength indicator.

19. The power supply system of claim 12 wherein the feedback signal includes at least one of a bit error rate and a frame error rate.

20. The power supply system of claim 12 wherein the configuration circuit is configured to control the at least one of the lookup circuit, the power supply, and the power amplifier to reduce the noise generated by the power amplifier responsive to receiving a public safety signal indicator signal indicating that the transceiver is in the presence of a public safety network.

* * * * *